US009658280B2

(12) United States Patent
Munson et al.

(10) Patent No.: US 9,658,280 B2
(45) Date of Patent: May 23, 2017

(54) TEST BOARD AND METHOD FOR QUALIFYING A PRINTED CIRCUIT BOARD ASSEMBLY AND/OR REPAIR PROCESS

(71) Applicant: Foresite, Inc., Kokomo, IN (US)

(72) Inventors: Terry L. Munson, Kokomo, IN (US); Steve Middleton, Cicero, IN (US)

(73) Assignee: Foresite, Inc., Kokomo, IN (US)

( * ) Notice: Subject to any disclaimer, the term of this patent is extended or adjusted under 35 U.S.C. 154(b) by 92 days.

(21) Appl. No.: 14/619,506

(22) Filed: Feb. 11, 2015

(65) Prior Publication Data

US 2015/0226789 A1  Aug. 13, 2015

Related U.S. Application Data

(60) Provisional application No. 61/938,225, filed on Feb. 11, 2014.

(51) Int. Cl.
*G01R 31/28* (2006.01)

(52) U.S. Cl.
CPC ..... *G01R 31/2812* (2013.01); *G01R 31/2815* (2013.01); *G01R 31/2817* (2013.01)

(58) Field of Classification Search
CPC ............ G01R 31/2815; G01R 31/2817; G01R 31/2812
See application file for complete search history.

(56) References Cited

U.S. PATENT DOCUMENTS

| 6,158,119 A | * | 12/2000 | Crist | ................... | H05K 1/0269 |
| | | | | | 29/593 |
| 6,185,273 B1 | * | 2/2001 | Sperschneider | ....... | G01N 23/18 |
| | | | | | 378/58 |

* cited by examiner

*Primary Examiner* — Patrick Assoud
*Assistant Examiner* — Haidong Zhang
(74) *Attorney, Agent, or Firm* — Woodard, Emhardt, Moriarty, McNett & Henry LLP

(57) ABSTRACT

A method for qualifying circuit board fabrication, assembly, and repair processes includes establishing primary assembly process specifications and secondary repair process specifications. A group of test circuit boards is assembled using the primary assembly process, with each board having a section of components linked together to provide functional circuits and a section of components daisy-chained together to provide non-functional circuits, and with each section also including SIR test patterns and CAF test patterns. A subset of the assembled test boards is then repaired using the secondary repair process. A sample of each set of the test boards is exposed to test conditions including thermal cycle test conditions, humidity test conditions, and vibration test conditions. Inner layer build quality, surface cleanliness, circuit performance, and solder joint quality are then evaluated using the provided circuitry.

6 Claims, 9 Drawing Sheets

1

TEST BOARD AND METHOD FOR QUALIFYING A PRINTED CIRCUIT BOARD ASSEMBLY AND/OR REPAIR PROCESS

FIELD OF THE INVENTION

The present invention relates generally to materials and methods used to qualify a process for assembling and/or repairing a circuit board.

BACKGROUND TO THE INVENTION

Class 3 circuit boards must be of high quality due to the importance of the circuits provided by the board. Accordingly, it is important to be able to evaluate the materials and methods used to fabricate and assemble the board and the circuit(s) on the board so that quality and reliability can be maintained. Inner layer quality and the presence of surface residue should be evaluated, as should the quality of solder joints used to assemble the board.

Standard fabrication and assembly methods do not include suitable materials and methods necessary to evaluate inner layer quality and the quality of assembled class 3 circuit boards. The present invention addresses that need.

SUMMARY OF THE INVENTION

In one aspect of the present invention there is provided a method and test board for qualifying processes for assembling and/or repairing a printed circuit board. In one embodiment the inventive method may be used to qualify a lead-free assembly process and/or a lead-free rework/repair process to determine whether it meets the standards established by another process, such as a leaded assembly and/or repair process.

In a first aspect of the present invention there is provided a method comprising:

a) providing primary assembly process specifications for assembling a circuit board, said specifications including the materials and methods to be used to assemble the board;

b) providing secondary repair process specifications for reworking and/or repairing a circuit board assembled by the primary assembly process, said specifications including the materials and methods to be used to rework or repair the board;

c) building a group of test circuit boards according to the primary assembly process specifications, wherein each of said test circuit boards includes a first section having components linked together to provide one or more functional circuits, wherein each of said test circuit boards includes a second section having components daisy-chained together to provide one or more non-functional circuits, wherein each of said first sections and each of said second sections includes one or more SIR test patterns effective for assessing surface cleanliness, wherein each of said first sections and each of said second sections includes one or more CAF test patterns effective for assessing inner layer build quality, and wherein each of said first sections is thermally and electrically isolated from each of said second sections;

d) reworking or repairing one or more portions of the first section of a sample of the group of test circuit board according to the secondary repair process specifications, and reworking or repairing one or more portions of the second section of a sample of the group of test circuit board using the secondary repair process specifications;

e) optionally separating the first section of one or more of the test boards from the second section of that board;

f) exposing samples of the first sections of the test boards processed only by the primary assembly process to test conditions comprising thermal cycle test conditions, humidity test conditions, and vibration test conditions;

g) exposing samples of the first sections of the test boards processed by both the primary assembly process and the secondary repair process to test conditions comprising thermal cycle test conditions, humidity test conditions, and vibration test conditions;

h) exposing samples of the second sections of the test boards processed only by the primary assembly process to test conditions comprising thermal cycle test conditions, humidity test conditions, and vibration test conditions;

i) exposing samples of the second sections of the test boards processed by both the primary assembly process and the secondary repair process to test conditions comprising thermal cycle test conditions, humidity test conditions, and vibration test conditions;

j) assessing the circuit performance of at least one functional circuit provided in the first section of a board processed only by the primary assembly process after the exposure to test conditions to evaluate the quality of the primary assembly process with respect to circuit quality;

k) assessing the circuit performance of at least one functional circuit provided in the first section of a board processed both by the primary assembly process and by the secondary repair process after the exposure to test conditions to evaluate the quality of the primary assembly process and the secondary repair process with respect to circuit quality;

l) assessing the solder joint quality of the non-functional components in the second section of a board processed only by the primary assembly process after the exposure to test conditions to evaluate the quality of the primary assembly process with respect to solder joint quality;

m) assessing the solder joint quality of the non-functional components in the second section of a board processed both by the primary assembly process and by the secondary repair process after the exposure to test conditions to evaluate the quality of the primary assembly process with respect to solder joint quality;

n) assessing the surface cleanliness of the areas of a test board having an SIR test pattern;

o) assessing the inner layer build quality of the areas of a test board having a CAF test pattern.

In a second aspect of the present invention there is provided a device comprising a circuit board having:

a) a first section having components linked together to provide one or more functional circuits, b) a second section having components daisy-chained together to provide one or more non-functional circuits, c) one or more SIR patterns effective for assessing surface cleanliness in said first section;

d) one or more SIR test patterns effective for assessing surface cleanliness in said second section;

e) one or more CAF test patterns effective for assessing inner layer build quality in said first section, and f) one or more CAF test patterns effective for assessing inner layer build quality in said second section;

wherein each of said first sections is thermally and electrically isolated from each of said second sections.

DESCRIPTION OF PREFERRED EMBODIMENTS

Figure 1:
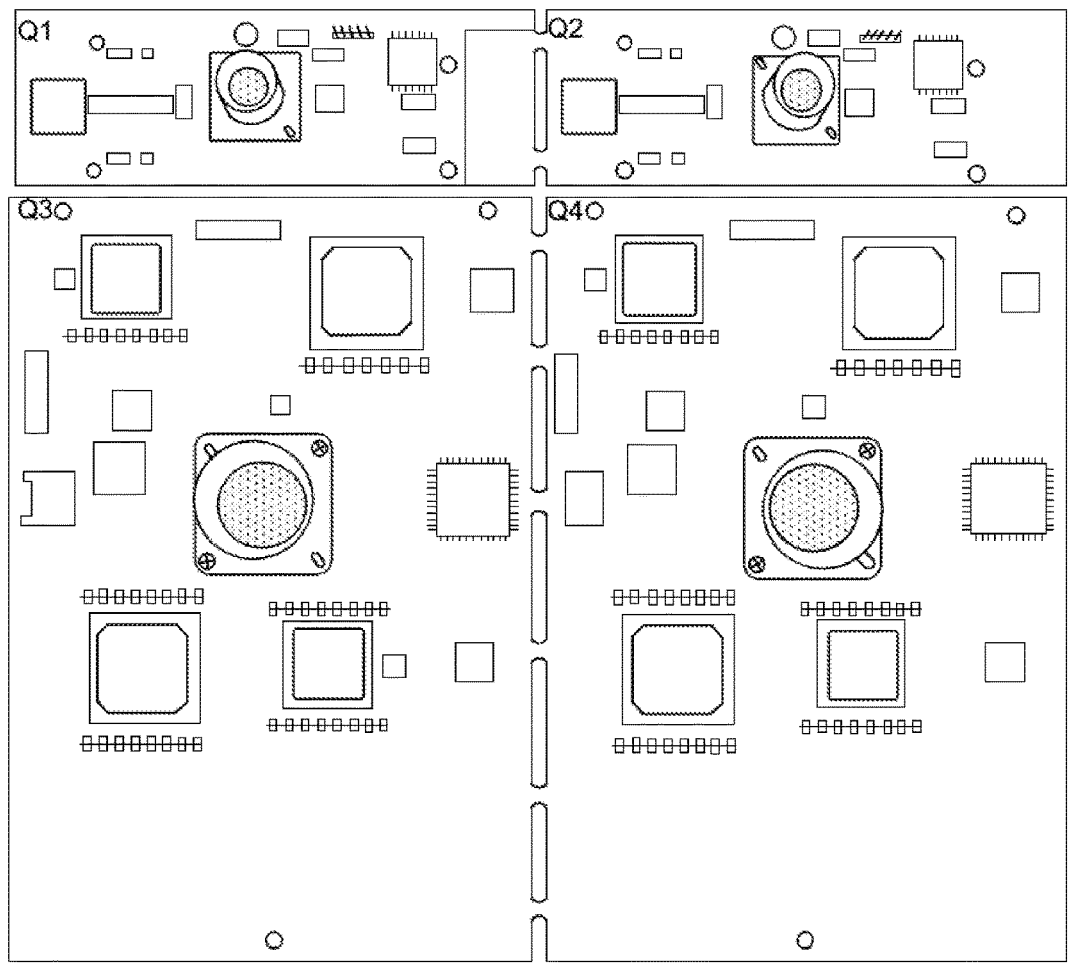
FIG. 1 shows a printed circuit board used in one embodiment of the present invention.

For the purposes of promoting an understanding of the principles of the invention, reference will now be made to certain embodiments and specific language will be used to describe the same. It will nevertheless be understood that no limitation of the scope of the invention is thereby intended, with such alterations and modifications to the illustrated device being contemplated as would normally occur to one skilled in the art to which the invention relates.

As indicated above, one aspect of the present invention provides a method and test board for qualifying processes for assembling and/or repairing a printed circuit board. For example, the inventive method may be used to qualify a lead-free assembly process and/or a lead-free rework/repair process. The method and test board may evaluate the process to determine whether it meets the standards established by another process, such as a leaded assembly and/or repair process.

In a first aspect of the present invention there is provided a method comprising:

a) providing primary assembly process specifications for assembling a circuit board, said specifications including the materials and methods to be used to assemble the board;

b) providing secondary repair process specifications for reworking and/or repairing a circuit board assembled by the primary assembly process, said specifications including the materials and methods to be used to rework or repair the board;

c) building a group of test circuit boards according to the primary assembly process specifications, wherein each of said test circuit boards includes a first section having components linked together to provide one or more functional circuits, wherein each of said test circuit boards includes a second section having components daisy-chained together to provide one or more non-functional circuits, wherein each of said first sections and each of said second sections includes one or more SIR test patterns effective for assessing surface cleanliness, wherein each of said first sections and each of said second sections includes one or more CAF test patterns effective for assessing inner layer build quality, and wherein each of said first sections is thermally and electrically isolated from each of said second sections;

d) reworking or repairing one or more portions of the first section of a sample of the group of test circuit board according to the secondary repair process specifications, and reworking or repairing one or more portions of the second section of a sample of the group of test circuit board using the secondary repair process specifications;

e) optionally separating the first section of one or more of the test boards from the second section of that board;

f) exposing samples of the first sections of the test boards processed only by the primary assembly process to test conditions comprising thermal cycle test conditions, humidity test conditions, and vibration test conditions;

g) exposing samples of the first sections of the test boards processed by both the primary assembly process and the secondary repair process to test conditions comprising thermal cycle test conditions, humidity test conditions, and vibration test conditions;

h) exposing samples of the second sections of the test boards processed only by the primary assembly process to test conditions comprising thermal cycle test conditions, humidity test conditions, and vibration test conditions;

i) exposing samples of the second sections of the test boards processed by both the primary assembly process and the secondary repair process to test conditions comprising thermal cycle test conditions, humidity test conditions, and vibration test conditions;

j) assessing the circuit performance of at least one functional circuit provided in the first section of a board processed only by the primary assembly process after the exposure to test conditions to evaluate the quality of the primary assembly process with respect to circuit quality;

k) assessing the circuit performance of at least one functional circuit provided in the first section of a board processed both by the primary assembly process and by the secondary repair process after the exposure to test conditions to evaluate the quality of the primary assembly process and the secondary repair process with respect to circuit quality;

l) assessing the solder joint quality of the non-functional components in the second section of a board processed only by the primary assembly process after the exposure to test conditions to evaluate the quality of the primary assembly process with respect to solder joint quality;

m) assessing the solder joint quality of the non-functional components in the second section of a board processed both by the primary assembly process and by the secondary repair process after the exposure to test conditions to evaluate the quality of the primary assembly process with respect to solder joint quality;

n) assessing the surface cleanliness of the areas of a test board having an SIR test pattern;

o) assessing the inner layer build quality of the areas of a test board having a CAF test pattern.

In a second aspect of the present invention there is provided a device comprising a circuit board having:

a) a first section having components linked together to provide one or more functional circuits, b) a second section having components daisy-chained together to provide one or more non-functional circuits, c) one or more SIR patterns effective for assessing surface cleanliness in said first section;

d) one or more SIR test patterns effective for assessing surface cleanliness in said second section;

e) one or more CAF test patterns effective for assessing inner layer build quality in said first section, and f) one or more CAF test patterns effective for assessing inner layer build quality in said second section;

wherein each of said first sections is thermally and electrically isolated from each of said second sections.

In a third aspect of the present invention there is provided a device comprising a circuit board having:

a) a first section having components linked together to provide one or more functional circuits, wherein said first section has been assembled by a primary assembly process comprising process specifications for assembling a circuit board, said primary assembly process specifications including the materials and methods to be used to assemble the board;

b) a second section having components daisy-chained together to provide one or more non-functional circuits, wherein said second section has been assembled by said primary assembly process;

c) a third section having components linked together to provide one or more functional circuits, wherein said third section has been assembled by said primary assembly process, and wherein said third section has been reworked or repaired by a secondary repair process comprising process specifications for reworking or repairing a circuit board, the repair process specifications including the materials and methods to be used to rework or repair the board;

d) a third section having components linked together to provide one or more functional circuits, wherein said third section has been assembled by said primary assembly process, and wherein said third section has been reworked or repaired by said secondary repair process;

e) one or more SIR patterns effective for assessing surface cleanliness in said first section;

f) one or more SIR test patterns effective for assessing surface cleanliness in said second section;

g) one or more CAF test patterns effective for assessing inner layer build quality in said first section, and h) one or more CAF test patterns effective for assessing inner layer build quality in said second section;

wherein each of said first sections is thermally and electrically isolated from each of said second sections.

1. Determining the Primary and Repair Process Specifications.

The present invention may be used to qualify a primary assembly process, or a rework/repair process, or preferably both. Accordingly, it is desired that a primary assembly process be specified with respect to all materials and methods to be used. This may include, inter alia, the raw board fabrication, the components to be assembled onto the board, the materials and methods to be used to solder or otherwise mount the components to the board, and other environmental factors relating to the build and/or assembly process. The specific layout of various components and/or circuits may also be specified.

2. Building the Test Boards.

In many cases it is extremely expensive to build and test boards intended for actual use, so a series of test boards may be assembled and tested instead. The test boards are assembled using the materials and methods specified in the process specifications, but the components and/or circuits may be simplified for testing purposes.

In one aspect of the present invention the test circuit boards each include a first section having components linked together to provide one or more functional circuits, and a second section having components daisy-chained together to provide one or more non-functional circuits. Each of the first sections and each of said second sections may also include one or more SIR (surface insulation resistance) test patterns effective for assessing surface cleanliness, and/or one or more CAF (conductive anodic filament) test patterns effective for assessing inner layer build quality. Each of the first sections is thermally and electrically isolated from each of the second sections.

The first "functional" section of each test board includes functional components such as chip components (e.g., chip capacitors and/or chip resistors), and/or functional packages such as BGAs, QFNs, etc., and/or connectors (such as military avionics-style connectors) that are connected to provide functional circuitry. The circuitry may provide functionality for one or more of: logic circuitry, clock circuitry, communications circuitry, plcc circuitry, component control circuitry, connectivity, etc.

The second "non-functional" section of each test board includes components that are daisy-chained together, but are not necessarily connected to provide functional circuits. With this arrangement the various components may be evaluated individually to determine whether the solder joint quality is acceptable. The components may include functional components such as chip packages, and/or functional component packages such as BGAs and/or QFNs that are daisy chained together in a non-functional circuit.

As previously indicated, one benefit of the present invention is the ability to test circuits that are less expensive to build than the circuits that are desired for a particular military or commercial need. Accordingly, in one aspect of the inventive method the step of providing primary assembly process specifications for assembling a circuit board comprises providing primary assembly process specifications for assembling a circuit board having a first circuit layout, but the step of building a group of test circuit boards according to the primary assembly process specifications comprises building a group of test circuit boards having a circuit layout different from the military- or commercially-desired layout. In other words, the step of building a group of test circuit boards according to the primary assembly process specifications comprises building a group of test circuit boards according to the primary assembly process specifications except that the circuit layout is for a second circuit differing from said first circuit. This allows test boards to be built and evaluated at significantly lower cost than would be experienced if the actual military- or commercially-specified boards were built and tested by destructive testing.

As previously indicated, one or more of the various board sections may include one or more SIR (surface insulation resistance) test patterns effective for assessing surface cleanliness, and/or one or more CAF (conductive anodic filament) test patterns effective for assessing inner layer build quality. These patterns, as well as other circuit components, may be positioned any place on the board that is effective to provide useful information regarding build quality and reliability. For example, chip capacitors may be positions near (e.g., about 50 mils from) wave solder through hole connections to asses residue transfer during a selective wave solder process. Similarly, micro-via-to-BGA ball SIR patterns may be provided on any or all of the sections of the test board. With the inventive test board structure it is possible to asses process cleanliness as indicated by a resistance change over time under selected environmental conditions, including temperature and/or humidity conditions that are indicative of, or more extreme than, the environment will be used to process boards in a commercial or other end-use situation.

All surface geometries may be provided by SIR test patterns. For example, one or more sets of parallel trace may be provided, and/or one or more comb patterns of interdigitated combs, and/or pad-to-ground QFN patterns, and/or pad-to-pad on LCC (e.g., 68 pin LCC), and/or via top and pad on BGAs.

In one embodiment the raw board is a standard eight-layer board printed circuit board having eight conductive layers and a corresponding number of insulating layers.

3. Exposing the Test Boards to Test Conditions.

After a series of test boards has been assembled, a subset of those boards is exposed to one or more "environmental" test conditions. Among the preferred "environmental" test conditions are humidity test conditions, thermal cycle test conditions, and vibration test conditions. Most preferably, some boards are exposed to both thermal cycle test conditions, and vibration test conditions, most preferably sequentially.

In one embodiment the humidity testing is conducted according to the following conditions: JEDEC Std 033C, JESD 201A (ramp to 40° C./95% RH, 120 hours Non-Biased. The details of the JEDEC Std 033C, JESD 201A conditions are incorporated herein by reference.

In one embodiment the thermal cycle testing is conducted according to the following conditions: JESD22-105C condition A (−40° C. to 85° C. for 500 cycles (1 hour each) Biased. The details of the JESD22-105C condition A is incorporated herein by reference.

In one embodiment the vibration testing is conducted according to the following conditions: JESD22-B103B (non-biased $1^{st}$ profile) Mil Std-HDBK-2164A (revised profile non-biased). The details of the JESD22-B103B (non-biased $1^{st}$ profile) Mil Std-HDBK-2164A (revised profile non-biased) conditions are incorporated herein by reference.

In addition to the above, mechanical testing may also be conducted. Such mechanical testing may include visual observation, evidence of tin whiskering, component shear testing, cross sectional evaluation of components and PCB areas of interest, testing of the cleanliness of surface areas, x-ray assessment of areas of interest, and partial or complete electrical continuity and isolation testing.

In one embodiment mechanical testing includes visual assessment to determine compliance with IPC 610-E.

In one embodiment mechanical testing includes assessing evidence of tin whiskering according to JESD-201A.

The preferred test method includes exposing the test boards to various environmental test conditions, including: a) exposing samples of the first sections of the test boards processed only by the primary assembly process to test conditions comprising thermal cycle test conditions, humidity test conditions, and vibration test conditions; b) exposing samples of the first sections of the test boards processed by both the primary assembly process and the secondary repair process to test conditions comprising thermal cycle test conditions, humidity test conditions, and vibration test conditions; c) exposing samples of the second sections of the test boards processed only by the primary assembly process to test conditions comprising thermal cycle test conditions, humidity test conditions, and vibration test conditions; d) exposing samples of the second sections of the test boards processed by both the primary assembly process and the secondary repair process to test conditions comprising thermal cycle test conditions, humidity test conditions, and vibration test conditions. For each type of test to be done, this may be accomplished by exposing a single board to all three test conditions, or by exposing a first board to a first (e.g., humidity) test and a second board to a second (e.g., temperature cycle) test and a third board to a third (e.g., vibration) test. Alternatively, a first board may be exposed to a first (e.g., humidity) test and a second board may be exposed to the other two (e.g., temperature cycle and vibration) tests. It is to be appreciated that any combination of the indicated tests, optionally also with other test conditions, may be performed on any of the test boards.

Similarly, a board processed by both the primary assembly process and the secondary repair process may be exposed to all three test conditions, or a first such board may be exposed to a first (e.g., humidity) test and a second such board may be exposed to a second (e.g., temperature cycle) test and a third such board may be exposed to a third (e.g., vibration) test. Most preferably, a first such board is exposed to a first (e.g., humidity) test and a second such board is exposed to the other two (e.g., temperature cycle and vibration) tests. As with the boards processed only by the primary assembly process, any combination of the test may be performed on any of the test boards.

The testing may be continued until a desired number of test cycles has been performed, or until the board fails.

4. Evaluating Build and/or Repair Quality.

The testing methods described above are evaluated to determine the quality of the fabricated board, the quality of the primary assembly process, and the quality of the secondary repair process.

In some embodiments the quality of the fabricated board is evaluated using the CAF (conductive anodic filament) test patterns built into the board by the board fabricator. Those CAF test patterns may include via-to-plane assessment and/or via-to-via assessment. For example, via-to-via CAF measurement points may be provided by an array of 6 mil vias spaced 10 mils apart, and/or by an array of 8 mil vias spaced 10 mils apart, and/or by an array of 8 mil vias spaced 14 mils apart. Inner layer performance may also be evaluated using inner layer plane-to-via CAF evaluation between vias and an inner conductive layer.

In another test pattern via holes are drilled, but are not plated. For example, multiple pairs of 6 mil unplated vias may be drilled 10 mils apart to provide useful test data.

Residue assessment under components such as micro BGAs may be conducted by measuring via-to-ball cleanliness.

Some evaluations are conducted during the testing itself, while other evaluations may be conducted after the test cycling is complete. For example, SIR patterns may be monitored throughout a test cycle so that the time of failure is observed and/or recorded.

To further support the specification and claims, the following information is provided. The information may be relevant to one or more aspects of the invention as would be appreciated by persons skilled in the art.

As previously indicated, one aspect of the present invention creates a set of conditions that an assembly process must meet to prove that the materials and process are reliable for use. For example, the method may create a set of conditions to verify that a lead-free assembly process must meet to prove that the materials and process are as reliable as the corresponding leaded hardware and process.

The system is designed as a tool to cost-effectively evaluate the interactions of:

1) the PCB fabricator laminate and process;
2) component-to-board solder and inner layer strength;
3) residue impact from all processing steps; and
4) rework/repair/modification effects of secondary soldering conditions on the overall system performance.

These interactions are evaluated within a set of defined conditions, with pass/fail criteria established by a set of standards. For example, when the system is used to evaluate the interactions of a lead-free process, the pass/fail criteria may be established by the current leaded process metrics.

One aspect of the invention provides a test board with functional and sensor technology built into the system.

One aspect of the invention provides a data acquisition system to monitor the various aspects of the board assembly.

One aspect of the invention provides conditional testing that stresses and assesses the critical aspects of the manufacturing process, including whisker and corrosion susceptibility.

One aspect of the invention provides a data base of process and material information acquired from the testing.

One aspect of the invention provides foundational pass/fail criteria of the testing protocol.

In one embodiment of the present invention a four quadrant test board is provided. Two of the quadrants are functional assemblies with sensitive circuits in typical mixed technology to assess:
1) circuit performance;
2) joint strength;
3) residue interaction from the PCB manufacturing process and subsequent cleaning challenges.

In the most preferred embodiment the two quadrants are the same or substantially the same, with quadrant 2 being a replica of quadrant 1. In the most preferred embodiments quadrants 1 and 2 are a test board made according to the specifications of the main circuit board (see, e.g., FIG. 9) of the environmental sensor disclosed in applicant's U.S. patent application Ser. No. 14/096,095, filed 4 Dec. 2013, the entire contents of which are incorporated herein by reference.

Quadrant 1 preferably demonstrates the primary assembly processes of SMT paste and reflow conditions, selective wave solder and residue interactions from these processes.

Quadrant 2 demonstrates the primary assembly process plus the secondary soldering and repair process. Accordingly, after initial board assembly, quadrant 2 is subjected to added repair operations incorporating hand soldering, IR/convection heat rework, and jumper wires tacked and hand soldered in place.

Quadrants 3 and 4 are designed to evaluate one or more aspects of solder joint reliability, residue effects, press fit connectivity, new component technology, and inner layer CAF assessment.

Quadrant 3 preferably has components such as BGAs, QFNs, and chip components (to assess solder joint life), with press fit and PTH connectors, and CAF innerlayer assessment patterns on various spacings, such as 6, 8, and 10 mil spacings.

Quadrant 4 is preferably a replica of quadrant 3, and is used to evaluate the rework, repair, and modification areas, plus any innerlayer effects of multiple soldering excursions.

As indicated above, one aspect of the invention may provide a data acquisition system to monitor the various aspects of the board assembly. In that aspect quads 1 and 2 may monitor a clock circuit, RF, high speed digital, innerlayer leakage/corrosion, and surface insulation resistance (SIR) between spaces such as 6 mil spaces. SIR may be used to evaluate the effects of residue entrapment areas under connectors and nearby selective solder residue on capacitors.

Quads 3 and 4 may be used to monitor innerlayer CAF test points, SIR test points on the surface QFN and BGA components, and daisy-chained QFN/BGA (e.g., 756 io and 1200 io) for open, fractured joints and compliant pin connector integrity.

Each reworked/repaired and modified quadrant is preferably tested in parallel with an unreworked/unrepaired and unmodified quadrant for comparison data.

As indicated above, one aspect of the invention provides conditional testing that stresses and assesses the critical aspects of the manufacturing process, including whisker and corrosion susceptibility. Such testing may include one or more of the following:
1) Life cycle testing on quadrants 1 and 2 by temperature cycling (e.g., $-25°$ C./$+85°$ C./500 cycles);
2) Thermal shock testing on quadrants 3 and 4 (e.g., $-55°$ C./$+125°$ C./100 cycles);
3) SIR testing at elevated temperature and humidity with bias (e.g., SIR testing at both $40°$ C./90% RH and $85°$ C./85% RH);
4) Three axis vibration under biased conditions;
5) CAF testing in elevated temperature and humidity conditions;
6) Functional testing of hardware in elevated temperature and humidity conditions;
7) Tin whisker evaluation (e.g. evaluation at both $70°$ C./50% RH for 10 days and $85°$ C./85% RH for 500 hours).

As indicated above, one aspect of the invention provides a data base of process and material information acquired from the testing. For example, a set of 25 or more sample PCBs may be built as a control group. Of the control group, some boards may be processed using the process and materials to be qualified, and of those, some boards may be processes so as to see only an ambient controlled environment. In addition, some boards may be processed using another assembly process. (For example, the process to be qualified may be a lead-free process and one control set may be a set of boards processed using an established leaded process conditioned with the same method and time frame as the lead-free samples.) A variety of (e.g., 16) parameters may be tested with data collected during the testing, for each board quadrant.

As indicated above, one aspect of the invention provides foundational pass/fail criteria of the testing protocol. For example, using tin lead soldered samples the functional and performance parameters that lead-free samples must meet or exceed may be established. During the failure analysis each sample may be documented and analyzed by one or more of:
1) C3 and ion chromatography, localized, cleanliness testing in multiple areas;
2) Cross-sectional analysis of specific solder joints;
3) Drop test and vibration test pass/fail criteria for hardware.

The inventive test board and method allows the evaluation of the validity and quality of a PCB assembly process, including the materials and methods used in that process. Factors to be evaluated may include one or more of:
1) Metal finish;
2) SMT/reflow;
3) PTH/wave soldering; and
4) Cleaning interactions;

The Quadrant 2 and quadrant 4 boards enable a user to evaluate the hand soldering and rework/repair and modification (jumper wire attachment) effects on product reliability under a process to be evaluated and a process to be used as a standard for the evaluation (e.g., a new lead-free process and a known leaded process).

The inventive boards and methods allow the establishment of "best practices," and process parameters that can be documented, such as in a PFMEA format.

As used herein:

1) a quadrant means a board or a section of board. Each quadrant may or may not be equal in size to ¼ the area of the board. In the most preferred embodiment each quadrant is a separate board that is physically attached to the other quadrants/boards so that the various quadrants/boards may be easily separated as desired.

2) a functional component means a component that is assembled on the board in a manner effective for the component to perform its intended function. Examples of components that may be assembled onto the board as functional components include BGAs, QFNs, LCCs, diodes, resistors, and connectors.

3) a non-functional component means a component that has been assembled onto the board in a manner that is effective for determining whether the solder joint and board fabrication quality is satisfactory, but not, or optionally not necessarily, in a manner effective for the component to perform its intended function. In one preferred embodiment the non-functional components are assembled onto the board in a "daisy chain" manner. Examples of components that may be assembled onto the board as non-functional components include BGAs, QFNs, LCCs, diodes, resistors, and connectors.

4) a primary process is a primary manufacturing and/or assembly process.

5) a secondary process is a rework or repair process.

6) functional testing is testing to evaluate whether functional components have been assembled onto a board in a manner effective for the components to function as required for their intended purpose on the board.

7) non-functional testing is testing to evaluate solder joint quality and/or board fabrication quality.

Referring now to the drawings, FIG. 1 shows a printed circuit board used in one embodiment of the present invention. Quadrant 1 (Q1) is a quadrant on which components have been assembled by a primary assembly process to provide a functional circuit. Quadrant 2 (Q2) is a quadrant on which components have been assembled by a primary assembly process and have had some components reworked and/or repaired using a secondary rework/repair process. Quadrant 3 (Q3) is a quadrant on which components have been assembled by a primary assembly process to provide a daisy-chained, non-functional circuit. Quadrant 4 (Q4) is a quadrant on which non-functional components have been assembled by a primary assembly process to provide a daisy-chained, non-functional circuit, and have then subsequently been reworked and/or repaired using a secondary rework/repair process.

Figure 2:
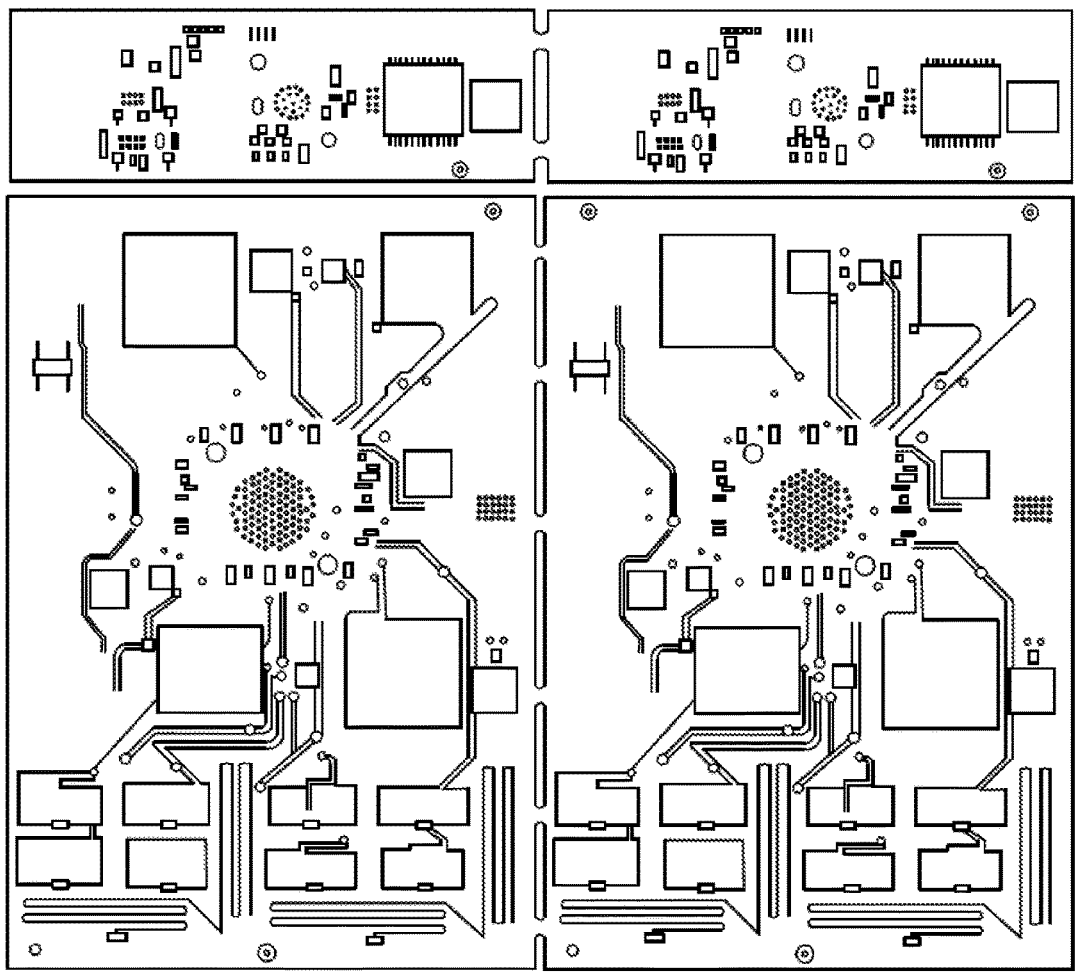
FIG. 2 shows the backside of the printed circuit board assembly of FIG. 1.

FIG. 2 shows the backside of the printed circuit board assembly of FIG. 1.

Figure 3:
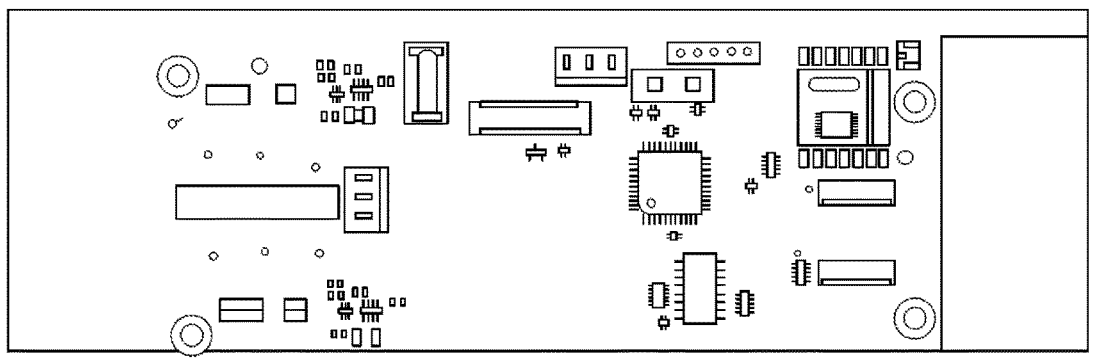
FIG. 3 shows an assembled first quadrant/board of a printed circuit board assembly used in one embodiment of the present invention.

FIG. 3 shows an assembled first quadrant/board of a printed circuit board assembly used in one embodiment of the present invention. Quadrant 1 (Q1) is a quadrant on which components have been assembled by a primary assembly process to provide a functional circuit on the board.

Figure 4:
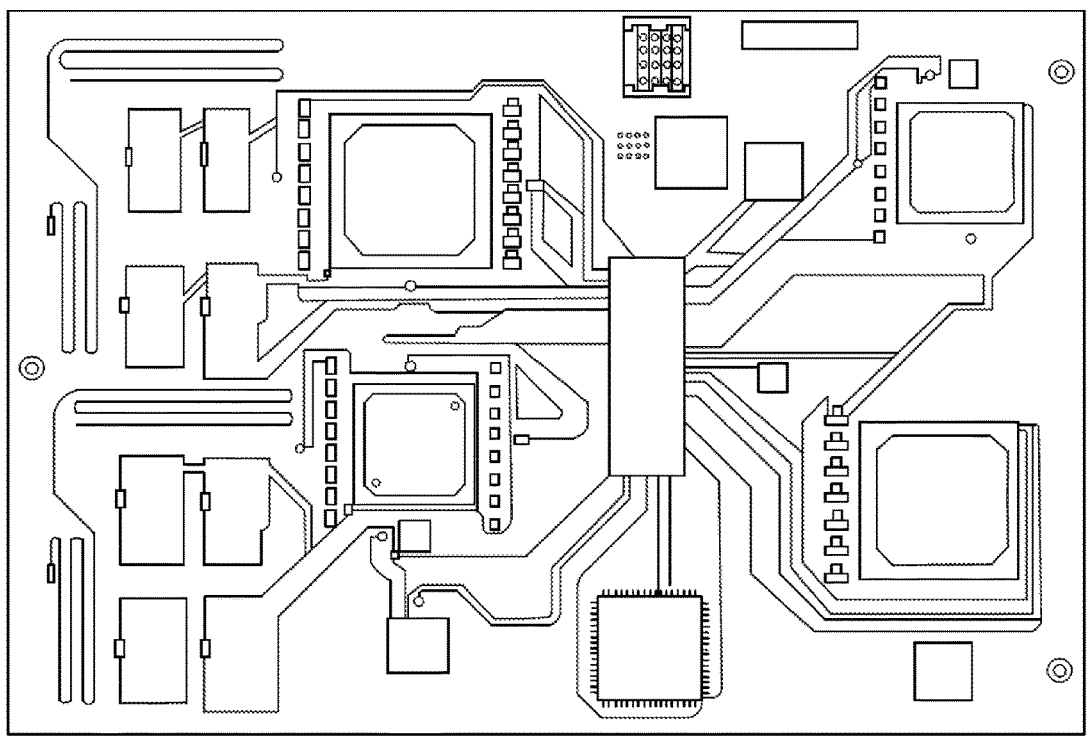
FIG. 4 shows an assembled third or fourth quadrant/board of a printed circuit board assembly used in one embodiment of the present invention.

FIG. 4 shows an assembled third or fourth quadrant/board of a printed circuit board assembly used in one embodiment of the present invention. Quadrants 3 (Q3) and 4 (Q4) are quadrants on which components have been assembled by a primary assembly process, and in the case of Q4, have been reworked and/or repaired by a secondary rework/repair process.

Figure 5:
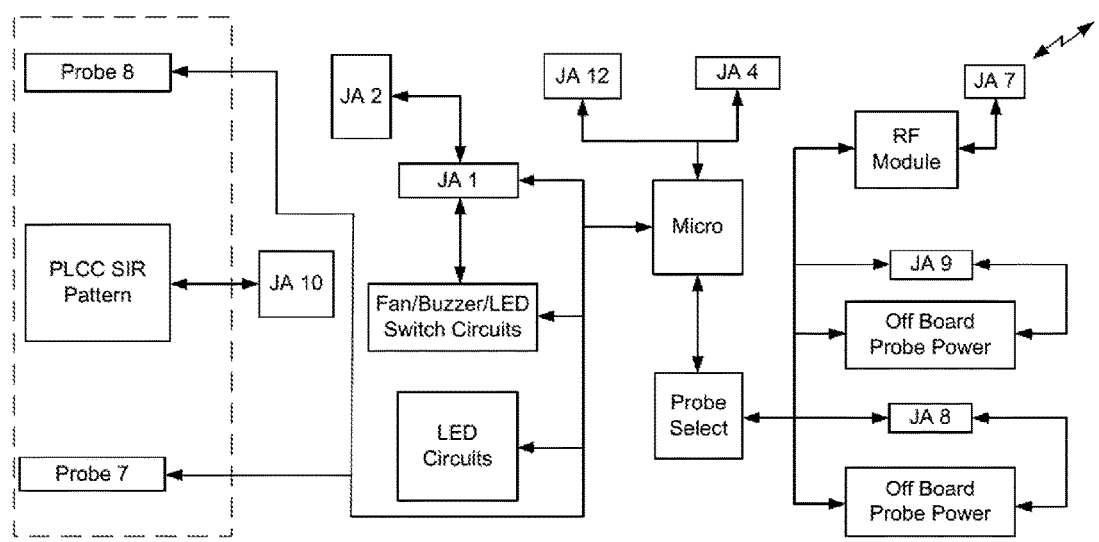
FIG. 5 is a schematic diagram of various functional components and connections as used on the first and second quadrants/boards of a printed circuit board assembly according to one embodiment of the present invention.

FIG. 5 is a schematic diagram of various functional components and connections as used on the first and second quadrants/boards of a printed circuit board assembly according to one embodiment of the present invention.

Figure 6:
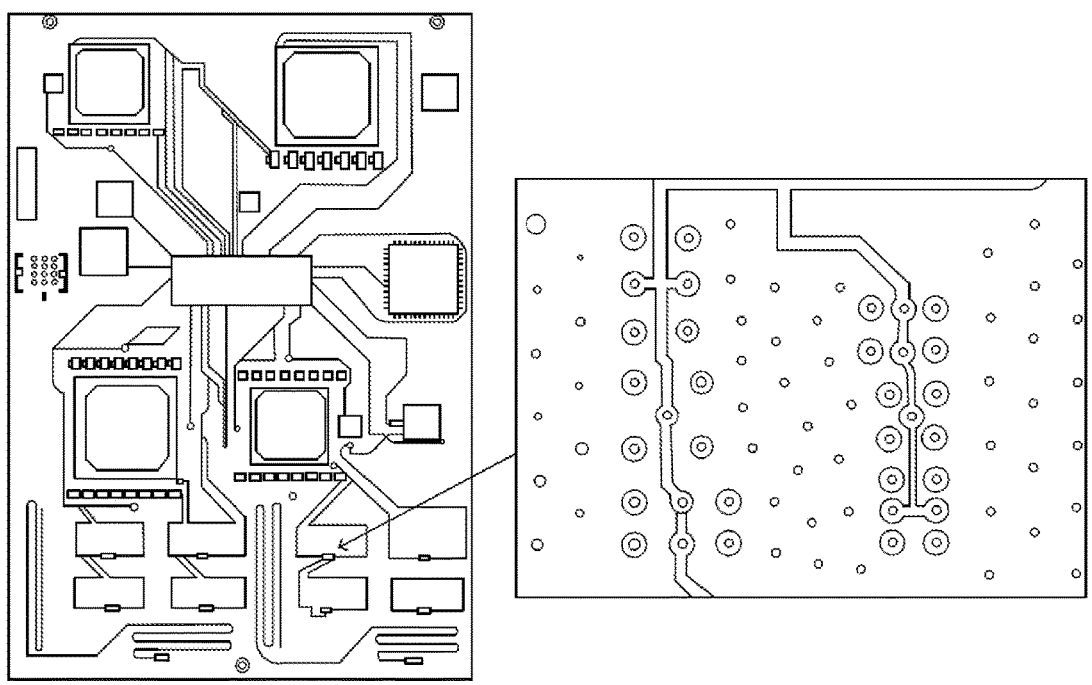
FIG. 6 shows an assembled third quadrant/board of a printed circuit board assembly used in one embodiment of the present invention.

FIG. 6 shows an assembled third quadrant/board of a printed circuit board assembly used in one embodiment of the present invention. Quadrant 3 (Q3) is a quadrant on which components have been assembled in a daisy-chain manner to provide a "non-functional" circuit. A portion of the quadrant/board is also shown in a magnified view, showing a CAF-testing pattern with 6 mil and 10 mil vias.

Figure 7:
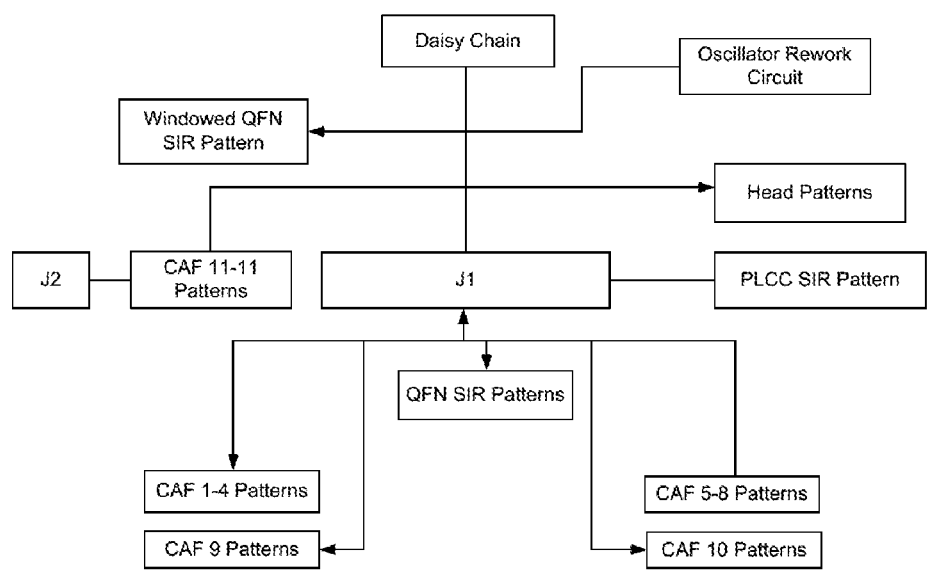
FIG. 7 is a schematic diagram of various components and connections as used on the third and fourth quadrants/boards of a printed circuit board assembly according to one embodiment of the present invention.

FIG. 7 is a schematic diagram of various components and connections as used on the third and fourth quadrants/boards of a printed circuit board assembly according to one embodiment of the present invention.

Figure 8:
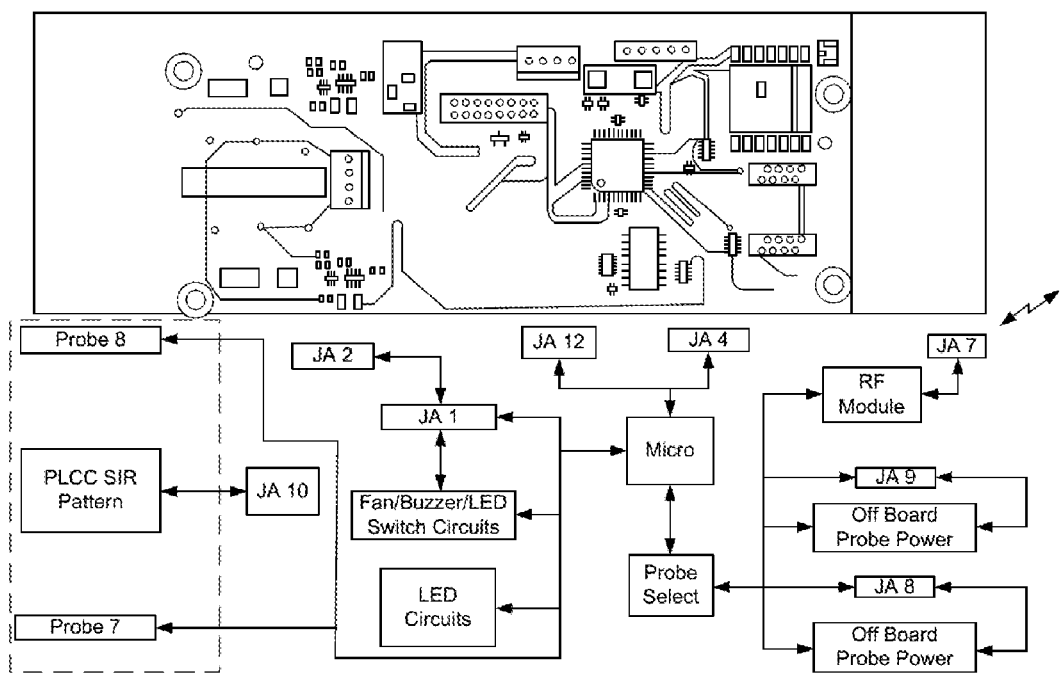
FIG. 8 shows the first and second quadrants/boards of a printed circuit board assembly used in one embodiment of the present invention.

FIG. 8 shows the first and second quadrants/boards of a printed circuit board assembly used in one embodiment of the present invention. A portion of the Figure shows an assembled quadrant/board, and a portion of the Figure shows a schematic diagram of various functional components and connections as used on the first and second quadrants/boards of a printed circuit board assembly according to one embodiment of the present invention.

Figure 9:
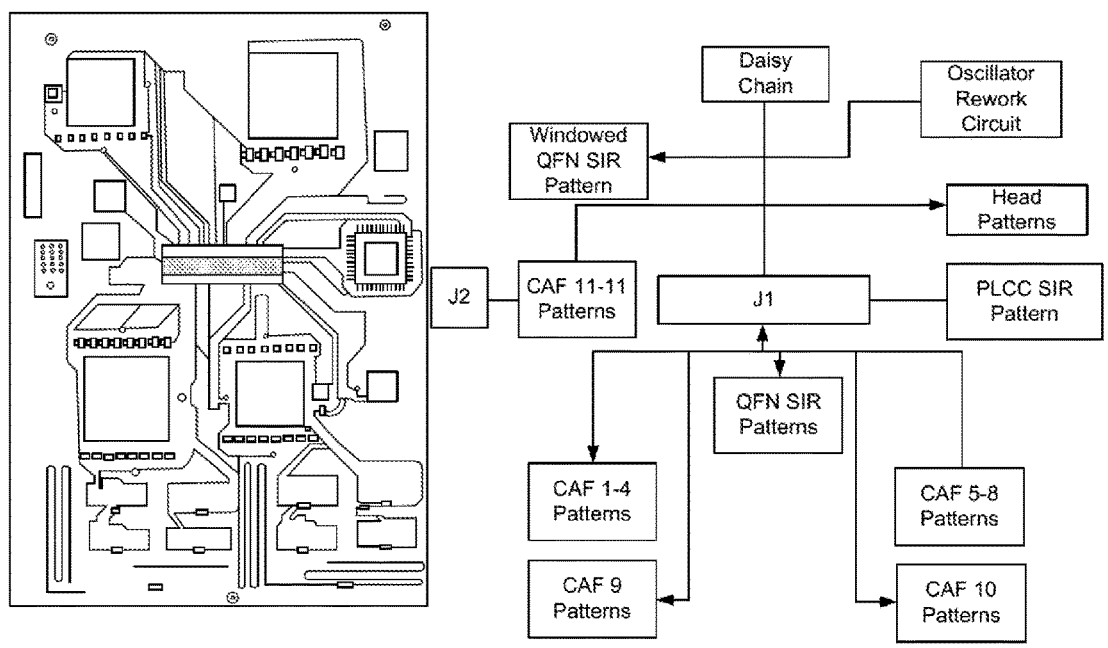
FIG. 9 shows the third and fourth quadrants/boards of a printed circuit board assembly used in one embodiment of the present invention.

FIG. 9 shows the third and fourth quadrants/boards of a printed circuit board assembly used in one embodiment of the present invention. A portion of the Figure shows an assembled quadrant/board, and a portion of the Figure shows a schematic diagram of various components and connections as used on the third and fourth quadrants/boards of a printed circuit board assembly according to one embodiment of the present invention.

The foregoing description of the preferred embodiments includes information contained in applicant's U.S. Provisional Patent Application 61/938,225, filed Feb. 11, 2014, the entire contents of which are hereby incorporated herein by reference.

While the invention has been illustrated and described in detail in the drawings and foregoing description, the same is to be considered as illustrative and not restrictive in character, it being understood that only certain preferred embodiments have been shown and described, and that all changes and modifications that come within the spirit of the invention are desired to be protected. In addition, it is to be appreciated that the present invention may comprise or consist essentially of any or all of the illustrated or described features. For example, the present invention may include methods and/or devices comprising each of the disclosed features, and/or the present invention may include methods and/or devices consisting essentially of any of the disclosed features. Additionally, any or all of the features and/or embodiments disclosed herein may be combined with any or all of the other features and/or embodiments disclosed herein to provide a device that comprises or consists essentially of such features.

The invention claimed is:

1. A method comprising:
   a) providing primary assembly process specifications for assembling a circuit board, said specifications including the materials and methods to be used to assemble the board;
   b) providing secondary repair process specifications for reworking and/or repairing a circuit board assembled by the primary assembly process, said specifications including the materials and methods to be used to rework or repair the board;
   c) building a group of test circuit boards according to the primary assembly process specifications for the materials and methods to be used to assemble the board, wherein each of said test circuit boards includes a first section having components linked together to provide a one or more functional circuits,
wherein each of said test circuit boards includes a second section having components daisy-chained together to provide one or more non-functional circuits,
wherein each of said first sections and each of said second sections includes one or more surface insulation resistance (SIR) test patterns effective for assessing surface cleanliness,
wherein each of said first sections and each of said second sections includes one or more conductive anodic filament (CAF) test patterns effective for assessing inner layer build quality, and
wherein each of said first sections is thermally and electrically isolated from each of said second sections;
d) reworking or repairing one or more portions of the first section of a sample of the group of test circuit board according to the secondary repair process specifications for the materials and methods to be used to rework or repair the board, and reworking or repairing one or more portions of the second section of a sample of the group of test circuit board using the secondary repair process specifications for the materials and methods to be used to rework or repair the board;
e) optionally separating the first section of one or more of the test boards from the second section of that board;
f) exposing samples of the first sections of the test boards processed only by the primary assembly process to test conditions comprising thermal cycle test conditions, humidity test conditions, and vibration test conditions;
g) exposing samples of the first sections of the test boards processed by both the primary assembly process and the secondary repair process to test conditions comprising thermal cycle test conditions, humidity test conditions, and vibration test conditions;
h) exposing samples of the second sections of the test boards processed only by the primary assembly process to test conditions comprising thermal cycle test conditions, humidity test conditions, and vibration test conditions;
i) exposing samples of the second sections of the test boards processed by both the primary assembly process and the secondary repair process to test conditions comprising thermal cycle test conditions, humidity test conditions, and vibration test conditions;
j) assessing the circuit performance of at least one functional circuit provided in the first section of a board processed only by the primary assembly process after the exposure to test conditions to evaluate the quality of the primary assembly process with respect to circuit quality;
k) assessing the circuit performance of at least one functional circuit provided in the first section of a board processed both by the primary assembly process and by the secondary repair process after the exposure to test conditions to evaluate the quality of the primary assembly process and the secondary repair process with respect to circuit quality;
l) assessing the solder joint quality of the non-functional components in the second section of a board processed only by the primary assembly process after the exposure to test conditions to evaluate the quality of the primary assembly process with respect to solder joint quality;
m) assessing the solder joint quality of the non-functional components in the second section of a board processed both by the primary assembly process and by the secondary repair process after the exposure to test conditions to evaluate the quality of the primary assembly process with respect to solder joint quality;
n) assessing the surface cleanliness of the areas of a test board having an SIR test pattern;
o) assessing the inner layer build quality of the areas of a test board having a CAF test pattern.

2. The method of claim 1 wherein said step of providing primary assembly process specifications for assembling a circuit board comprises providing primary assembly process specifications for assembling a circuit board having a first circuit layout, and wherein said step of building a group of test circuit boards according to the primary assembly process specifications comprises building a group of test circuit boards according to the primary assembly process specifications except that the circuit layout is for a second circuit differing from said first circuit.

3. The method of claim 1 wherein the building step comprises building a group of test circuit boards with two quadrants of components linked together to provide a one or more functional circuits, and two quadrants of components daisy-chained together to provide one or more non-functional circuits, and wherein the reworking or repairing step comprises reworking or repairing one of those two quadrants but not reworking or repairing the other of those two quadrants.

4. A device comprising a circuit board having:
a) a first section having components linked together to provide one or more functional circuits, wherein said first section has been assembled by a primary assembly process comprising process specifications for assembling a circuit board, said primary assembly process specifications including the materials and methods to be used to assemble the board, wherein said first section has not been reworked or repaired;
b) a second section having components daisy-chained together to provide one or more non-functional circuits, wherein said second section has been assembled by said primary assembly process, wherein said second section has not been reworked or repaired;
c) a third section having components linked together to provide one or more functional circuits, wherein said third section has been assembled by said primary assembly process, and wherein said third section has been reworked or repaired by a secondary repair process comprising process specifications for reworking or repairing a circuit board, said repair process specifications including the materials and methods to be used to rework or repair the board;
d) a fourth section having components daisy-chained together to provide one or more non-functional circuits, wherein said fourth section has been assembled by said primary assembly process, and wherein said fourth section has been reworked or repaired by said secondary repair process;
wherein each of said first sections and each of said second sections and each of said third sections and each of said fourth sections includes one or more surface insulation resistance (SIR) test patterns effective for assessing surface cleanliness,
wherein each of said first sections and each of said second sections and each of said third sections and each of said fourth sections includes one or more conductive anodic filament (CAF) test patterns effective for assessing inner layer build quality, wherein each of said first sections is thermally and electrically isolated from each of said second sections, and wherein each of said third sections is thermally and electrically isolated from each of said fourth sections.

5. The device of claim 4 wherein the device comprises two sections having components linked together to provide one or more functional circuits, and two sections having components daisy-chained together to provide one or more non-functional circuits.

6. The device of claim 4 wherein one of the two sections having components linked together to provide one or more functional circuits has been reworked or repaired, and wherein one of the two sections having components daisy-chained together to provide one or more non-functional circuits has been reworked or repaired.

* * * * *

UNITED STATES PATENT AND TRADEMARK OFFICE
CERTIFICATE OF CORRECTION

PATENT NO. : 9,658,280 B2  
APPLICATION NO. : 14/619506  
DATED : May 23, 2017  
INVENTOR(S) : Terry L. Munson et al.

Page 1 of 1

It is certified that error appears in the above-identified patent and that said Letters Patent is hereby corrected as shown below:

In the Specification

Column 1, Line 4 Please add the following after the Title and before the Field of the Invention:
GOVERNMENT LICENSE RIGHTS
This invention was made with Government support under HQ0006-10-C-7204 awarded by Missile Defense Agency. The Government has certain rights in the invention.

Signed and Sealed this
Eighteenth Day of February, 2020

Andrei Iancu
*Director of the United States Patent and Trademark Office*